(12) United States Patent
Schmitz et al.

(10) Patent No.: US 10,746,773 B2
(45) Date of Patent: Aug. 18, 2020

(54) TEST SYSTEM AND METHOD FOR MEASURING BEAM CHARACTERISTICS

(71) Applicant: Rohde & Schwarz GmbH & Co. KG, Munich (DE)

(72) Inventors: Sebastian Schmitz, Planegg (DE); Corbett Rowell, Munich (DE); Vincent Abadie, Hohenschaeftlarn (DE)

(73) Assignee: Rhode & Schwarz GmbH & Co. KG, Munich (DE)

( * ) Notice: Subject to any disclaimer, the term of this patent is extended or adjusted under 35 U.S.C. 154(b) by 507 days.

(21) Appl. No.: 15/607,317

(22) Filed: May 26, 2017

(65) Prior Publication Data

US 2018/0340966 A1 Nov. 29, 2018

(51) Int. Cl.
| | |
|---|---|
| *G01R 29/10* | (2006.01) |
| *G01R 33/028* | (2006.01) |
| *G01R 29/08* | (2006.01) |
| *G01R 31/302* | (2006.01) |

(52) U.S. Cl.
CPC ............ *G01R 29/10* (2013.01); *G01R 33/028* (2013.01); *G01R 29/0878* (2013.01); *G01R 31/3025* (2013.01)

(58) Field of Classification Search
CPC .............. G01R 33/028; G01R 31/3025; G01R 29/0878; G01R 29/10; G01R 31/2822
See application file for complete search history.

(56) References Cited

U.S. PATENT DOCUMENTS

| | | | |
|---|---|---|---|
| 6,285,330 B1* | 9/2001 | Perl .................. | G01R 29/10 342/360 |
| 2003/0156585 A1 | 8/2003 | Minami et al. | |
| 2008/0067397 A1* | 3/2008 | Tsukihara ........... | H01J 37/3171 250/396 ML |
| 2011/0043418 A1* | 2/2011 | Teshirogi ........... | G01R 29/0821 343/703 |
| 2011/0115683 A1 | 5/2011 | Herrmann | |
| 2012/0038522 A1* | 2/2012 | Miyata ................. | G01R 29/10 343/703 |
| 2012/0137779 A1 | 6/2012 | Graff et al. | |
| 2015/0346314 A1 | 12/2015 | Underbrink et al. | |
| 2016/0359718 A1* | 12/2016 | Banerjee et al. ..... | H04L 43/50 |

FOREIGN PATENT DOCUMENTS

| | | |
|---|---|---|
| EP | 2194387 A1 | 6/2010 |
| WO | WO2009038388 A1 | 3/2009 |

* cited by examiner

*Primary Examiner* — Alvaro E Fortich
(74) *Attorney, Agent, or Firm* — Potomac Technology Law, LLC

(57) ABSTRACT

A test system for measuring beam characteristics of a device under test (DUT) is provided. The system comprises a DUT, a measurement antenna configured to receive electro-magnetic radiation emitted by the DUT, a link antenna configured to provide a test communication link to the DUT, and a control and analyzing unit configured to control a beam steering of the device under test and to analyze signals from the device under test received by the measurement antenna. The test communication data transmitted to the device under test comprises beam steering control data in order to control the beam steering of the DUT.

18 Claims, 4 Drawing Sheets

TEST SYSTEM AND METHOD FOR MEASURING BEAM CHARACTERISTICS

TECHNICAL FIELD

The invention relates to a test system and a method for measuring beam characteristics of a device under test with the aid of a measurement antenna, a link antenna and a control and analyzing unit.

BACKGROUND

Generally, measuring beam characteristics of a device under test (DUT) requires an antenna to receive the radiation emitted by the DUT.

The WIPO publication WO 2009/038388 A1 relates to a system and a method for measuring a radiation pattern of an antenna under test by using a source antenna in an antenna radiation pattern measurement device. The document discloses that said antenna radiation pattern measurement device comprises a control unit for controlling driving of the source antenna and the antenna under test, an analysis unit for measuring an electric field value from a radio frequency signal that is transmitted from one of the source antenna and the antenna under test and received by the other antenna. The communication between the analysis unit/control unit and the antennas is realized via a cable connection. Disadvantageously, such cable connections influence the radiation characteristic of an antenna and increase the effort when preparing a test setup. Furthermore, cable connections increase the cost and the measurement error rate, since cables can be damaged or can change transmission properties due to wrong installation or rough handling.

Accordingly, there is a need for a test system and a method for measuring beam characteristics of a device under test (DUT), providing an improved communication link for transmitting beam steering control data in order to control the beam steering of the DUT.

SOME EXAMPLE EMBODIMENTS

Embodiments of the present invention advantageously address the foregoing requirements and needs, as well as others, by providing a test system and a method for measuring beam characteristics a device under test (DUT), providing an improved communication link for transmitting beam steering control data in order to control the beam steering of the DUT.

According to a first aspect of the invention, a test system for measuring beam characteristics of electro-magnetic radiation emitted by a device under test is provided. The test system comprises a device under test (DUT). The system is configured to receive electro-magnetic radiation emitted by the DUT preferably through a measurement antenna. The system further comprises a link antenna configured to provide a test communication link to the DUT, and a control and/or analyzing unit configured to control a beam steering of the DUT and to analyze signals from the DUT preferably but not necessarily received by the measurement antenna. Advantageously test communication data comprising beam steering control data in order to control the beam steering of the DUT is transmitted to the DUT, which may but need not be through the link antenna, whereby the link antenna is positioned in the near field of the radiation generated by the DUT.

According to a first example implementation form of the first aspect, the measurement antenna is movable around the DUT. Instead of using a movable antenna, the use of group antennas, particularly a phased array antenna is conceivable to receive the electro-magnetic radiation emitted by the DUT without moving the measurement antenna.

According to a further example implementation form of the first aspect, the DUT is mounted on a holder configured to adjust the position of the DUT.

According to a further example implementation form of the first aspect, the DUT is movable (e.g., in a rotating or tilting manner). Advantageously, the option to adjust the position of the DUT reduces measurement time and increases measurement accuracy.

Advantageously, the positioning of the link antenna in the near field of the radiation of the DUT requires less transmission power of the link antenna to transmit data to the DUT. A reduced transmission power emitted by the link antenna prevents that the link antenna radiation influences the electro-magnetic radiation generated by the DUT. Thus, the measurement by the measuring antenna is not distorted by the wireless communication between the DUT and the control/analyzing unit via the link antenna. Further, due to the positioning of the link antenna in the near field there is no need to reposition the link antenna when the beam characteristic is changed.

According to a further example implementation form of the first aspect, the test system comprises a link antenna that is movable relative to the DUT. Advantageously, this allows for fine tuning the link antenna position to the desired location in the near field.

According to a further example implementation form of the first aspect, the link antenna is mounted not at the same side as the measurement antenna with respect to the DUT. In most applications, the preferred side of the DUT, is the side, where the antenna of the DUT is located. Advantageously, positioning the link antenna not at the same side as the DUT, reduces a distortion of the electro-magnetic radiation emitted by the DUT and measured by the measurement antenna.

According to a further example implementation form of the first aspect, the link antenna is located inside a radiation shielding area. Advantageously, shielding the link antenna avoids distortion of the electro-magnetic radiation emitted by the DUT and to be received by the measurement antenna.

According to a further example implementation form of the first aspect, one part of the shielding area is formed by a frame configured to incorporate the DUT.

According to a further example implementation form of the first aspect, the frame provides a recess to receive and then to include the DUT.

According to a further example implementation form of the first aspect, the recess contains an opening and/or is made of a radio frequency transparent material configured to transmit the radiation emitted by the link antenna. Advantageously, the opening in the recess or the radiofrequency transparent material, that can be provided instead of the opening, provides a non-shielded area to establish a communication between the link antenna and the DUT. Further, the frame can be easily replaced by another frame with a different recess and a different opening in the recess that might be required for another DUT. As such, several different frames can be provided as a test adapter for different DUTs to provide a convenient option to test different devices under test with the test system. It is also conceivable that the different frames include ID tags or another form of coding that is known to the person skilled in the art and that said coding contains the desired position of the link antenna. Thus, the link antenna can automatically be moved to the required position.

According to a further example implementation form of the first aspect, the DUT includes a test interface to input beam steering data and/or communication data to the DUT. Advantageously, the provided test interface can serve as a separate communication channel between the link antenna and the DUT, without the need to use the antenna of the DUT that emits the electro-magnetic radiation for the communication between the link antenna and the DUT.

According to a further example implementation form of the first aspect, the test interface is configured to receive beam steering data and/or communication data in a wireless way.

According to a further example implementation form of the first aspect, the test interface is configured to receive beam steering data or communication data via cable. Advantageously, the transmission of beam steering data or communication data via cable and the wireless transmission of the non-cable transmitted data allows for analyzing the influence of a wired connection on the beam characteristic of the radiation emitted by the DUT.

According to a second aspect of the invention, a method for measuring beam characteristics of electro-magnetic radiation emitted by a device under test (DUT) is provided. The method comprising the steps of establishing a test communication link to the DUT with the aid of a link antenna, transmitting test communication data including beam steering control data through the link antenna to the DUT, controlling a beam steering of the DUT with the aid of a control/analyzing unit, receiving electro-magnetic radiation emitted by the DUT preferably but not necessarily with the aid of a measurement antenna and analyzing the electro-magnetic radiation received by the measurement antenna with the aid of the control/analyzing unit. Advantageously test communication data comprising beam steering control data in order to control the beam steering of the DUT is transmitted to the DUT (which may but need not be) through the link antenna. The method further comprises the step of positioning the link antenna in the near field of the radiation emitted by the DUT.

According to an example implementation form of the second aspect, the method further comprises the step of moving the link antenna relative to the DUT when performing the measurement.

According to a further example implementation form of the second aspect, the method further comprises the step of shielding the radiation generated by the link antenna. Advantageously, no radiation generated by the link antenna is received by the measurement antenna. Thus, a distortion of the measuring signal due to the communication signal is prevented.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A test system and a method for measuring beam characteristics a device under test (DUT), providing an improved communication link for transmitting beam steering control data in order to control the beam steering of the DUT, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
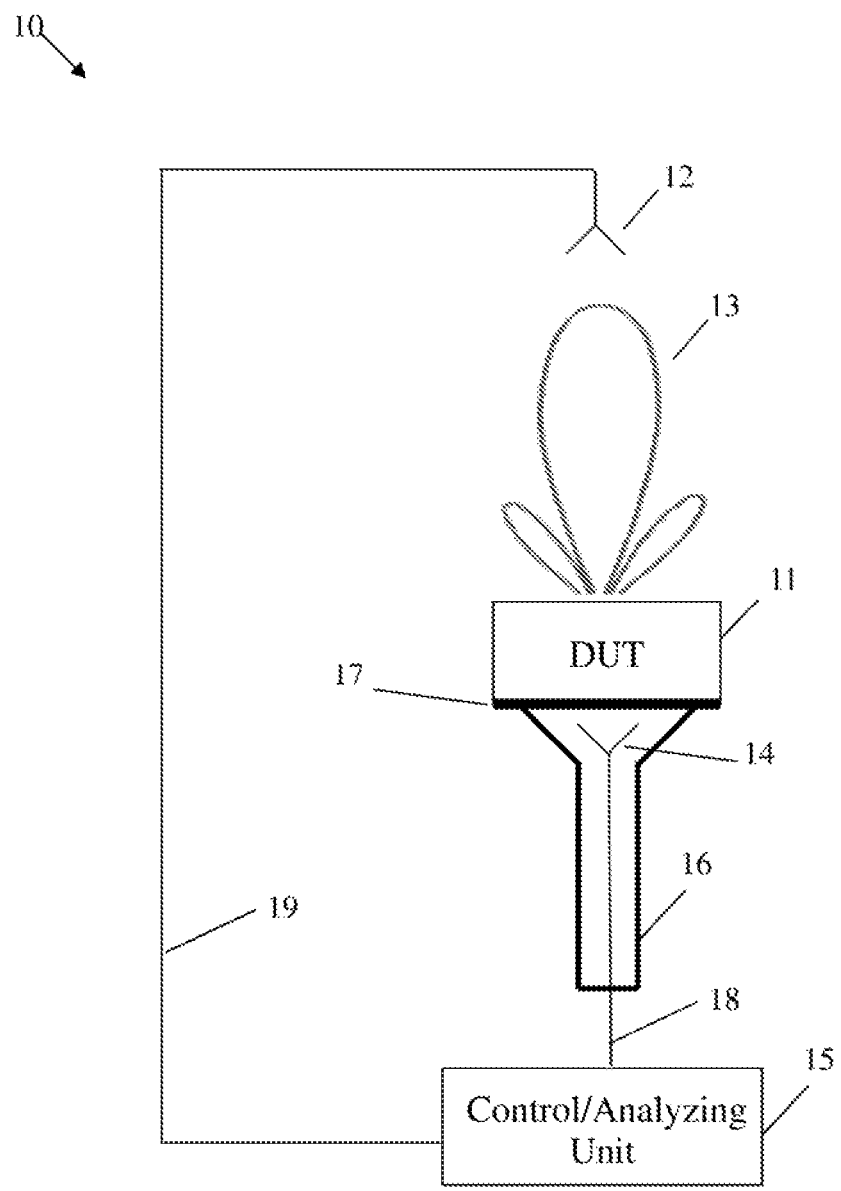
FIG. 1 shows a diagram of test system for measuring beam characteristics of electro-magnetic radiation emitted by a device under test, in accordance with example embodiments of the present invention.

FIG. 1 shows a diagram of test system 10 for measuring beam characteristics of electro-magnetic radiation emitted by a device under test (DUT), in accordance with example embodiments of the present invention. The invention is not limited to this embodiment and all features below are explained for the purpose of example only.

According to example embodiments, the test system 10 comprises the DUT 11, a measurement antenna 12, a link antenna 14 and a control/analyzing unit 15 connected to the link antenna 14 via a cable connection 18 and connected to the measurement antenna 12 via a cable connection 19. Further, a shielding 16, 17 of the link antenna 14 is depicted in FIG. 1.

By way of example, the DUT 11 may include a test interface to input beam steering data and/or communication data to the DUT. Advantageously, such test interface prevents the need to use the antenna of the DUT for wireless communication, which would result in a distortion of the beam characteristic measurement of the DUT.

By way of further example, the measurement antenna 12 may be a single horn-antenna that is movable in all directions around the DUT. Arm positioners or robotic arms to provide this functionality are well known to the person skilled in the art and are therefore not described within this document.

By way of further example, several antenna elements may be provided to form a phased array antenna, which allows the measurement of the electro-magnetic radiation 13 emitted by the DUT 11, without moving the measurement antenna 12.

By way of further example, the link antenna 14 may be a patch antenna or a horn antenna that is located in the near field of the electro-magnetic radiation 13 emitted by the DUT 11. Since non-radiative near-field behaviors of electromagnetic fields dominate close to the antenna of the DUT, the radiation transmitted by the link antenna is not influenced by the radiation emitted by the DUT 11, which requires reduced transmission power of the link antenna 14. Advantageously, a reduced transmission power of the link antenna 14 prevents that the link antenna radiation is received by the measurement antenna 12 and negatively impacts the measurement of the beam characteristics.

According to further example embodiments, the control/analyzing unit 15 is configured to control a beam steering of the DUT 11 and to analyze signals 13 from the DUT 11 received by the measurement antenna 12. The communication data 13 generated by the control/analyzing unit 15 and transmitted to the DUT 11 through the link antenna 14 comprises beam steering control data in order to control the beam steering of the DUT.

Figure 2:
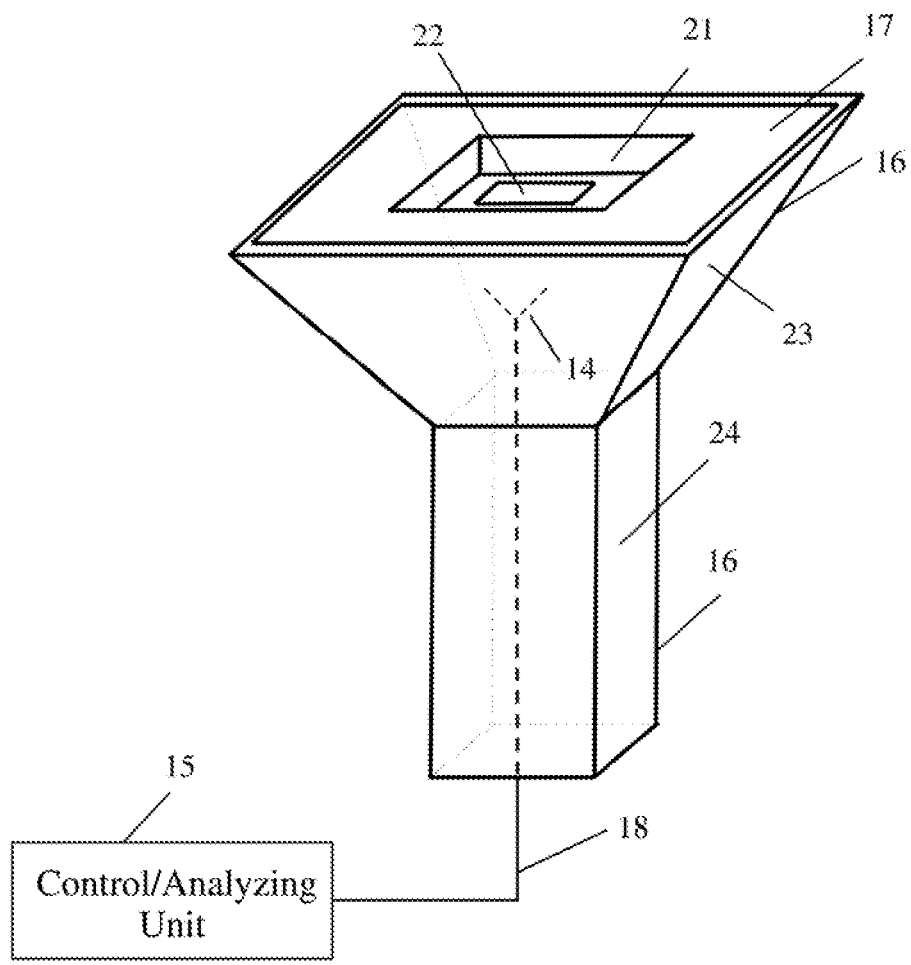
FIG. 2 shows a diagram of the shielding of FIG. 1, including a frame to mount the device under test as part of the shielding, in accordance with example embodiments of the present invention.

Further, FIG. 1 shows a shielding 16, 17 of the link antenna 14, that is shown in more detail in FIG. 2. A purpose of the shielding is to prevent that radiation generated by the link antenna 14 is received by the measurement antenna 12 and falsifies the measurement result of the beam characteristics measurement.

Advantageously, the test system 10 according to the present invention does not require a wired connection between the DUT 11 and the control/analyzing unit 15. Since a wired connection to the DUT 11 modifies the radiation characteristics of the DUT 11, thus another beam characteristic than defined by the control/analyzing unit 15 would be emitted by the DUT.

FIG. 2 shows a diagram of the shielding 16, 17 of FIG. 1, including a frame 17 to mount the DUT 11 as part of the shielding, in accordance with example embodiments of the present invention.

According to example embodiments, the shielding 16 has the form of a truncated pyramid 23, wherein at the opposite side of the pyramid base a cuboid 24 extends. Other forms of shielding geometries are conceivable. The frame 17 for mounting the DUT 11 that is part of the shielding provides a recess 21 to receive and then include the DUT 11. The recess 21 has an opening 22 on the bottom side to provide a passage for the electro-magnetic radiation generated by the link antenna to the test interface provided to input beam steering data and/or communication data to the DUT.

According to further example embodiments, instead of an opening 22 in the recess 21 a material that is permeable for radio frequency radiation (RF) can be provided.

According to further example embodiments, the frame 17 for mounting the DUT 11 can be replaceable by frames with different recesses, openings or even no recess or no opening to be able to use several measurement adapters that allow for testing different DUTs with different geometry, with a limited effort to change the test setup. Advantageously, testing identical devices with a test adapter maintains the same measurement conditions for each measurement and increases reproducibility.

Figure 3:
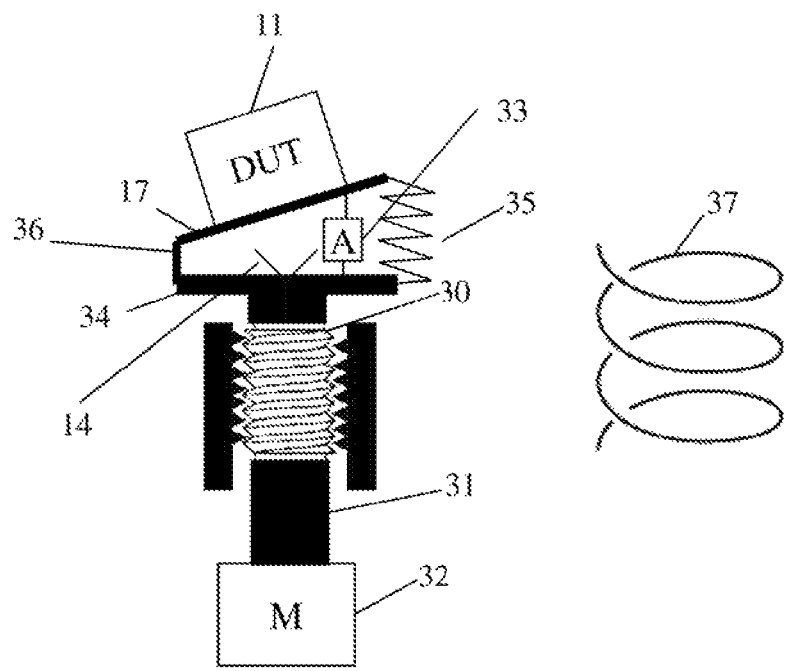
FIG. 3 shows an example holder that may be used to hold and adjust the position of the device under test, in accordance with example embodiments of the present invention.

FIG. 3 shows an example holder or positioner that may be used to hold and adjust the position of the DUT, in accordance with example embodiments of the present invention According to example embodiments, the frame 17 is configured to incorporate the DUT 11 is connected to a hinge 36 that is connected to a first planar surface 34 attached to a first end of an axis 31, wherein the axis 31 comprises a thread 30 for moving the first planar surface 34 up and down with the aid of a motor 32 attached to a second end of the axis 31. Accordingly, rotating the axis 31 with the aid of the motor 32 serves the height adjustment of the first planar surface 34, and thus also of the DUT 11.

Further, the DUT 11 is attached to a second planar surface, which is the frame 17, configured to incorporate the DUT 11 which is attached to the first planar surface 34 in a manner whereby the DUT may be tilted for example with the hinge 36 mentioned before. For the purpose of tilting the DUT 11, and thus for tilting the frame 17 configured to incorporate the DUT 11 with respect to the first planar surface 34, the positioner comprises an actuator 33 which tilts the second planar surface 17 with respect to the first planar surface 34.

According to example embodiments, the shielding for the embodiment according to FIG. 3 is realized by the first planar surface 34, the hinge or similar element to allow for tilting the second planar surface 17 with respect to the first planar surface 34, the first planar surface which is the frame configured to mount the DUT, which is described in detail in FIG. 2. Further, a flexible shielding material 35 is provided, that is connected to one end of the first planar surface 34 and to one end of the second planar surface 17.

In addition to this, FIG. 3 illustrates an example trace 37 of movement of the DUT 11 in the case that the DUT 11 is moved down in a tilted condition, which leads to the helical trace 37.

Figure 4:
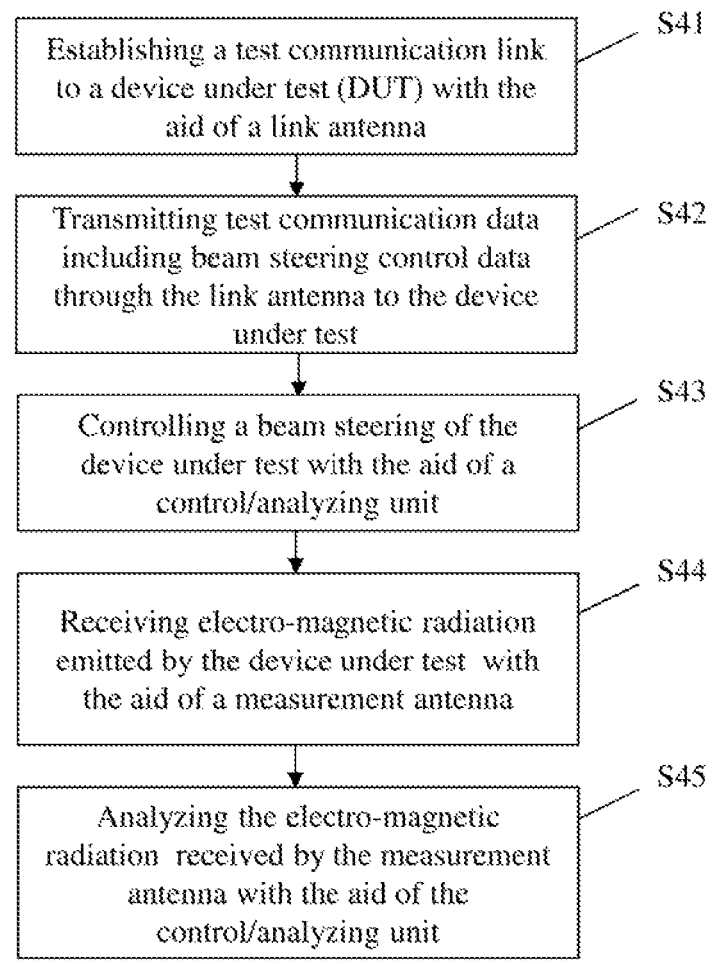
FIG. 4 shows a flow chart of a method for measuring beam characteristics of electro-magnetic radiation emitted by a device under test, in accordance with example embodiments of the present invention.

FIG. 4 shows a flow chart of a method for measuring beam characteristics of electro-magnetic radiation emitted by a DUT (DUT), in accordance with example embodiments of the present invention. In a first step S41, a test communication link to a DUT (DUT) 11 is established with the aid of a link antenna 14. In a second step S42, test communication data including beam steering control data is transmitted through the link antenna 14 to the DUT 11. In a further step S43, beam steering of the DUT 11 is controlled with the aid of a control/analyzing unit 15. In a further step S44, electro-magnetic radiation 13 emitted by the DUT 11 is received with the aid of a measurement antenna 12. In step S45, the electro-magnetic radiation received by the measurement antenna 12 is analyzed with the aid of the control/analyzing unit 15.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

For example the measurement antenna can also be adjusted to act as link antenna. As link antenna beam can then be adjusted in a certain position, a switch to a measurement antenna for measurement of the fixed beam is possible very easily

What is claimed is:

1. A test system for measuring beam characteristics, the system comprising:
   a device under test;
   a link antenna configured to provide a test communication link to the device under test;
   a measurement antenna configured to receive electro-magnetic radiation emitted by the device under test; and
   a processor configured to control a beam steering of the device under test and to analyze the electro-magnetic radiation via corresponding signals received from the measurement antenna; and
   wherein test communication data transmitted to the device under test comprises beam steering control data in order to control the beam steering of the device under test, and
   wherein the link antenna is positioned in the near field of the radiation emitted by the device under test, and
   steering control data in order to control the beam steering of the device under test, and wherein the link antenna is positioned in the near field of the radiation emitted by the device under test, and
   wherein the measurement antenna is positioned at a one side of the device under test and the link antenna is positioned at a side of the device under test other than the one side to reduce distortion of the electro-magnetic radiation emitted by the device under test and received by the measurement antenna.

2. The test system according to claim 1, wherein the measurement antenna is movable around the device under test.

3. The test system according to claim 1, wherein the device under test is mounted on a holder configured to adjust the position of the device under test.

4. The test system according to claim 3, wherein the device under test is one or more of movable, rotatable and tiltable.

5. The test system according to claim 4, wherein the test communication data is transmitted through the link antenna.

6. The test system according to claim 4, wherein the link antenna is movable relative to the device under test.

7. The test system according to claim 1, wherein the link antenna and the measurement antenna are mounted on different sides of the device under test.

8. The test system according to claim 1, wherein the link antenna is located inside a radiation shielding area.

9. The test system according to claim 8, wherein one part of the shielding area is formed by a frame configured to incorporate the device under test.

10. The test system according to claim 9, wherein the frame provides a recess to include the device under test.

11. The test system according to claim 10, wherein the recess includes an opening or is made of a radio frequency transparent material configured to transmit the radiation emitted by the link antenna.

12. The test system according to claim 1, wherein the device under test includes a test interface configured to receive one or more of beam steering data and communication data.

13. The test system according to claim 12, wherein the test interface is configured to receive the one or more of the beam steering data and communication data wirelessly.

14. The test system according to claim 12, wherein the test interface is configured to receive the one or more of the beam steering data and communication data via a cable.

15. A method for measuring beam characteristics of a device under test, the method comprising:
    establishing a test communication link to the device under test via a link antenna;
    transmitting test communication data to the device under test via the link antenna, wherein the test communication data includes beam steering control data for controlling a beam steering of the device under test;
    receiving electro-magnetic radiation emitted by the device under test via a measurement antenna;
    analyzing the electro-magnetic radiation via corresponding signals received from the measurement antenna;
    positioning the link antenna in a near field of the electro-magnetic radiation emitted by the device under test; and
    positioning the measurement antenna at a one side of the device under test and positioning the link antenna at a side of the device under test other than the one side to reduce distortion of the electro-magnetic radiation emitted by the device under test and received by the measurement antenna.

16. The method according to claim 15, wherein the test communication data is transmitted to the device under test via the link antenna.

17. The method according to claim 16, further comprising moving the link antenna relative to the device under test when measuring the beam characteristics.

18. The method according to claim 16, further comprising shielding radiation generated by the link antenna.

* * * * *

UNITED STATES PATENT AND TRADEMARK OFFICE
CERTIFICATE OF CORRECTION

PATENT NO. : 10,746,773 B2
APPLICATION NO. : 15/607317
DATED : August 18, 2020
INVENTOR(S) : Sebastian Schmitz, Corbett Rowell and Vincent Abadie It is certified that error appears in the above-identified patent and that said Letters Patent is hereby corrected as shown below:

In the Claims

Claim 1, Lines 20-23 (Column 7, Lines 21-24) - Delete the text of these lines, beginning with "steering control data" and ending with "emitted by the device under test, and".

Claim 17, Line 1 (Column 8, Line 43) - Delete the claim number "16", and instead insert the claim number --15--.

Claim 18, Line 1 (Column 8, Line 46) - Delete the claim number "16", and instead insert the claim number --15--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*